United States Patent [19]

Kray

[11] 4,080,483

[45] Mar. 21, 1978

[54] N-CYANOSULFONAMIDE RESINS AND INTERMEDIATES THEREFOR AND PRODUCTS THEREOF

[75] Inventor: Raymond J. Kray, Berkeley Heights, N.J.

[73] Assignee: Ciba-Geigy Corporation, Ardsley, N.Y.

[21] Appl. No.: 792,949

[22] Filed: May 2, 1977

Related U.S. Application Data

[62] Division of Ser. No. 661,468, Feb. 26, 1976, Pat. No. 4,049,711, which is a division of Ser. No. 439,487, Feb. 4, 1974, Pat. No. 3,944,526.

[51] Int. Cl.² .............................................. C08G 75/30
[52] U.S. Cl. .............................. 428/290; 260/79.3 M; 260/47 R; 260/49; 260/63 N; 428/426; 428/474; 428/901; 428/902

[58] Field of Search .............. 428/289, 290, 426, 474, 428/901, 902; 260/79.3 M, 47 R, 49, 63 N

[56] References Cited

U.S. PATENT DOCUMENTS

| 3,308,101 | 3/1967 | Ikeda ................................ 260/2 R |
| 3,654,192 | 4/1972 | Vogel ............................ 260/79.3 M |
| 3,694,408 | 9/1972 | Hynds et al. ..................... 260/551 C |

*Primary Examiner*—James J. Bell
*Attorney, Agent, or Firm*—Luther A. R. Hall

[57] ABSTRACT

This invention provides compositions containing polysulfonamides which are prepared by the addition polymerization of bis-N-cyanosulfonamides. The resins are useful in coating, molding, laminating and casting applications.

10 Claims, No Drawings

N-CYANOSULFONAMIDE RESINS AND INTERMEDIATES THEREFOR AND PRODUCTS THEREOF

This is a divisional of application Ser. No. 661,468, filed on Feb. 26, 1976 now U.S. Pat. No. 4,049,711, which in turn is a divisional of Ser. No. 439,487, filed on Feb. 4, 1974, now U.S. Pat. No. 3,944,526, issued Mar. 16, 1976.

DETAILED DISCLOSURE

This invention relates to a new class of nitrogenous polymeric materials. More particularly, it relates to polysulfonamides which are prepared by the addition polymerization of bis-N-cyanosulfonamides, which are novel compounds.

In accordance with this invention a new class of polysulfonamide resins for use in coating, laminating, molding and casting applications has been discovered. These resins are distinguished by their ease of fabrication, low raw material cost and exceptional elevated temperature and electrical properties.

These resins are prepared from polymerizable compositions which contain organic groups of the formula (I)

which unexpectedly have been found to undergo an addition polymerization reaction believed to involve the trimerization of the cyano moiety.

In one embodiment of this invention polymerizable compositions are described which contain in their molecules two or more of I attached to one or more divalent aromatic, aliphatic, cycloaliphatic or heterocyclic radicals.

The divalent aromatic radicals may be linked by divalent groups such as

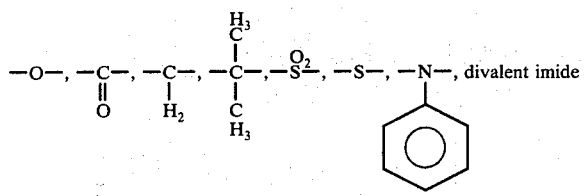

and amide structures such as

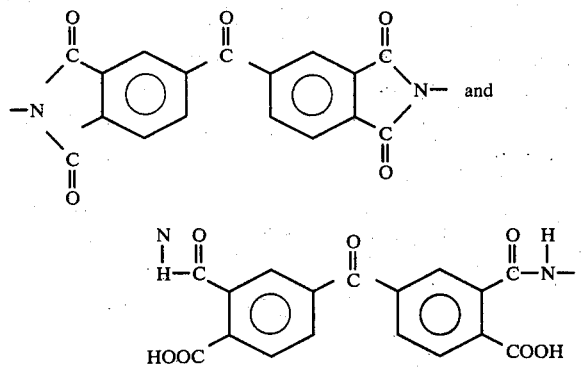

The divalent groups may also be heterocyclic such as thiadiazolyl, pyronyl, benzimidazolyl and the like. The divalent aromatic groups may be substituted with halogens in order to achieve greater fire retardancy. An example of a compound in this embodiment is shown by the following structure.

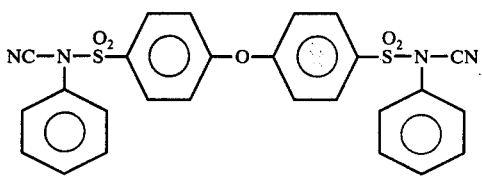

The divalent aliphatic and cycloaliphatic groups may be alkylene of 1-18 carbons, preferably 1-7, cycloalkylene of 3-7 carbons, and such radicals bearing electronegative substituents such as halogens, especially fluoro.

In another embodiment of this invention compositions containing I are copolymerized with compositions containing two or more cyanamide groups of the formula (II)

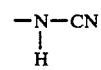

These cyanamide groups are attached to one or more divalent aromatic, aliphatic or heterocyclic radicals. The divalent radicals can be linked by divalent groups such as —S— and those described above. An example of a compound containing the cyanamide groups described in the second embodiment is given by the following structure.

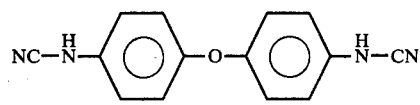

The reaction of such compounds containing two or more cyanamide groups with a compound containing only one of I, i.e., monofunctional N-cyanosulfonamides, is also encompassed by this embodiment.

The polymerizable compositions of this invention may be either pure compounds or oligmers that cure by an addition polymerization mechanism to yield crosslinked resins having a high glass transition temperature and good oxidative stability at temperatures up to approximately 500° F. Applications as circuit boards, encapsulating resins for electrical use (potting compounds), high temperature adhesives, compression and transfer molding compounds, powder coatings and resin matrices for inorganic and organic fiber composites such as laminates with glass, boron, polyamide and graphite fibers, are visualized.

The N-cyanosulfonamide compounds and cyanamide compounds are prepared by the following synthetic routes. The compounds containing two N-cyanosulfonamide groups are novel. Their synthesis is illustrated below.

$$H_2N-R-NH_2 + 2\ CNCl \longrightarrow NC-\overset{H}{N}-R-\overset{H}{N}-CN$$

$$\downarrow 2\ R'-SO_2-Cl$$

$$\underset{A}{NC-N-R-N-CN} \atop \underset{R'}{\overset{SO_2}{|}} \quad \underset{R'}{\overset{SO_2}{|}}$$

A $$2\ R'-\overset{H}{N}-CN + Cl-\overset{O_2}{\underset{}{S}}-R-\overset{O_2}{\underset{}{S}}-Cl \longrightarrow \underset{B}{NC-\underset{R'}{N}-\overset{O_2}{\underset{}{S}}-R-\overset{O_2}{\underset{}{S}}-\underset{R'}{N}-CN}$$

B

[Structure showing NC-N(R')-SO₂-C₆H₄-NH₂ + dianhydride → bis-imide product]

C

In structures A and B above, R' is a monovalent aliphatic, cycloaliphatic, aromatic or heterocyclic group and R is a divalent aliphatic, cycloaliphatic, aromatic, or heterocyclic group linked by divalent groups such as $$-O-,\ -\overset{O}{\underset{}{C}}-,\ -\overset{CH_3}{\underset{CH_3}{\overset{|}{C}}}-,\ -\overset{C_6H_5}{\underset{}{N}}-,\ -\overset{}{\underset{O_2}{C}H_2}-,\ -\overset{}{\underset{}{S}}-,$$

and $-S-$ and R' is phenyl,

The groups R contained within a single molecule may be all the same or different, and similarly the groups R' contained within a single molecule may be all the same or different. The groups may also be halogenated. Preferred structures of the N-cyanosulfonamide compounds include

[Structures showing NC-N(SO₂Ph)-C₆H₄-N(SO₂Ph)-CN (ortho, meta or para) and NC-N(SO₂Ph)-C₆H₄-X-(C₆H₄-X)ₙ-C₆H₄-N(SO₂Ph)-CN (ortho, meta or para)]

wherein X is $$-O-,\ -\overset{H_2}{\underset{}{C}}-,\ -\overset{C_6H_5}{\underset{}{N}}-,\ -\overset{}{\underset{O_2}{S}}-,\ -S-,\ -\overset{O}{\underset{}{C}}-,\ \text{and}\ -\overset{CH_3}{\underset{CH_3}{\overset{|}{C}}}-\ \text{and}$$

a single bond and $n$ is zero to five.

[Structure of NC-N(Ph)-SO₂-C₆H₄-X-C₆H₄-SO₂-N(Ph)-CN]

wherein X is $-O-,\ -\overset{H_2}{\underset{}{C}}-,\ -\overset{Ph}{\underset{}{N}}-,\ -S-,\ -\overset{}{\underset{O_2}{S}}-,\ -\overset{O}{\underset{}{C}}-,$

[Structure showing $-\overset{CH_3}{\underset{CH_3}{\overset{|}{C}}}-,\ -N(\text{bis-imide-dione})N-$ and $-N(C=O)(C_6H_3\text{-COOH})-C(=O)-C_6H_3(\text{COOH})-C(=O)-NH-$]

In the structures directly above, the

[benzene ring image]

group can be replaced by

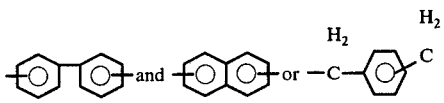

groups without interfering with the concept of this invention. Similarly, any of the hydrogen atoms in these benzenoid radicals may be replaced with chlorine, bromine or fluorine groups without lessening utility.

In the synthesis of the N-cyanosulfonamide compounds by the reaction sequences shown under A it is necessary to use a sulfonyl chloride. The sulfonyl chloride can be reacted with a biscyanamide derived from a diamine or first reacted with a diamine to yield a sulfonamide which is then reacted with a cyanogen halide to yield the desired N-cyanosulfonamide compound. Overall yields by either route are in excess of 80%. Suitable aromatic sulfonyl chlorides for these reaction sequences include benzene sulfonyl chloride, p-chlorobenzene sulfonyl chloride, p-toluene sulfonyl chloride, 2-naphthalenesulfonyl chloride and anthracene-2-sulfonyl chloride. Suitable aliphatic and cylcoaliphatic sulfonyl chlorides are methane sulfonyl chloride, ethane sulfonyl chloride, trifluoromethylsulfonyl chloride, $n$ and iso propyl sulfonyl chloride, $n$ and iso butyl sulfonyl chloride, $n$ and iso amyl sulfonyl chloride, cyclopentane sulfonyl chloride, n-hexyl sulfonyl chloride, cyclohexane sulfonyl chloride and n-heptyl and n-octyl sulfonyl chlorides. Among the suitable heterocyclic sulfonyl halides are thiophene-2-sulfonyl chloride and benzopyran-6-sulfonyl chloride.

In the synthesis of the N-cyanosulfonamide compounds of alternate structure shown under B disulfonyl chlorides can be reacted with an amine like aniline to yield the corresponding sulfonamide which is then reacted with cyanogen halide or reacted with a cyanamide to yield the desired compound. Overall yields by either route are in excess of 80%. Specific examples of the preferred aromatic disulfonyl halides used in the present invention include: benzene-1,3-disulfonyl chloride; benzene-1,3-disulfonyl bromide; 2,4,5,6-tetrachlorobenzene-1,3-disulfonyl chloride; naphthalene-1,5-disulfonyl chloride; o-xylene-3,5-disulfonyl chloride; p-xylene-2,6-disulfonyl chloride; naphthalene-2,7-disulfonyl chloride; diphenyl-4,4'-disulfonyl chloride; diphenyl ether-4,4'-disulfonyl chloride; diphenyl sulfide-4,4'-disulfonyl chloride; and benzophenone-4,4'-disulfonyl chloride. Examples of aliphatic and cycloaliphatic disulfonyl halides are methane disulfonyl chloride; ethane-1,2-disulfonyl chloride; cyclohexane disulfonyl chloride; propyl-1,3-disulfonyl chloride; and isobutylene-1,3-disulfonyl chloride. Examples of heterocyclic disulfonyl halides are dibenzothiophene-3,6-disulfonyl chloride; and diphenyl-2,2-sulfonyl-4,4'-disulfonyl chloride.

When the above bis —N— cyanosulfonamide compounds are heated above their melting points the fluid melt becomes increasingly viscous and eventually thermosets to yield a hard plastic having utility in structural applications, i.e., moldings, castings, composites, and for protective uses, i.e., coatings. The temperature/time relationship for thermosetting is shown below for 4,4'-methylene bis (N-benzene sulfonyl phenyl cyanamide), m.p. 129° C.

Table I

| Polymerization of 4,4'-Methylene Bis(N-Benzene Sulfonyl Phenyl Cyanamide) | |
|---|---|
| Polymerization Temperature ° C. | Gel Time |
| 240 | 3 minutes |
| 200 | 35 minutes |
| 190 | 5 hours |
| 185 | 7 hours |
| 180 | 10 hours |

A differential thermal analysis run with this compound showed a polymerization exotherm between approximately 199°–240° C. which gave a heat of polymerization of 33.7 kilo cal/mole. The increase in the glass transition temperature (Tg) of the polymer at various cure temperatures and times measured by a Torsional Braid analyzer is shown below.

Table II

| Torsional Braid Analysis of Poly-4,4'-Methylene Bis(N-benzene sulfonyl phenyl cyanamide) | | |
|---|---|---|
| Cure Temperature ° C. | Cure Time in Hours | Tg° C. |
| 200 | 3.5 | 250 |
| 240 | 0.5 | 253 |
| 300 | 0.5 | 290 |
| 300 | 1.0 | 350 |

An elemental analysis run on the monomer before curing and after curing at 300° C. is shown below indicating that the polymer has essentially the same elemental analysis as the monomer and has not evolved condensation products or oxidized in air at 300° C. to any significant extent.

Table III

| Elemental Analysis of Poly-4,4'-Methylene bis(N-benzene sulfonyl phenyl cyanamide) after 300° C. Cure in Air | |
|---|---|
| Monomer Analysis | Polymer Analysis after 300° C. Cure |
| %C 61.9 | 63.3 |
| %H 4.11 | 4.22 |
| %N 10.6 | 12.8 |
| %S 11.5 | 10.5 |

Heating of the compound N-benzene sulfonyl phenyl cyanamide at 240° C. for 3 hours gave a product showing, by infrared absorption, the presence of the s-triazine ring and absence of nitrile group absorption at 2220 cm$^{-1}$. A molecular weight measurement by vapor phase osmometry showed that the molecular weight had approximately tripled which would indicate that a trimerization reaction had taken place.

A possible, but not necessarily the only polymerization mechanism, for N-cyanosulfonamide compounds is illustrated below:

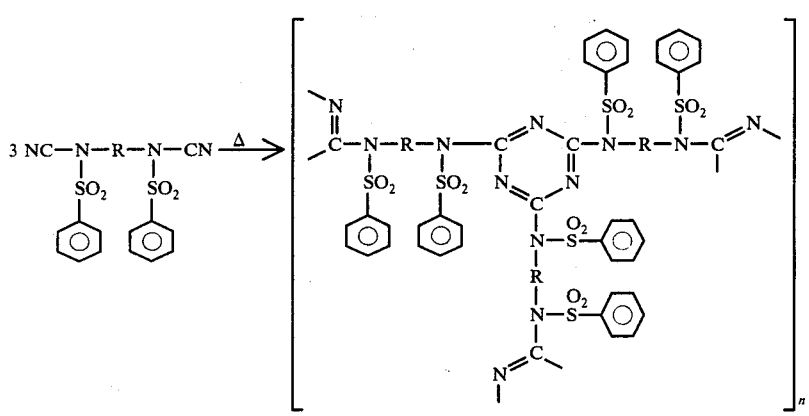

or alternately

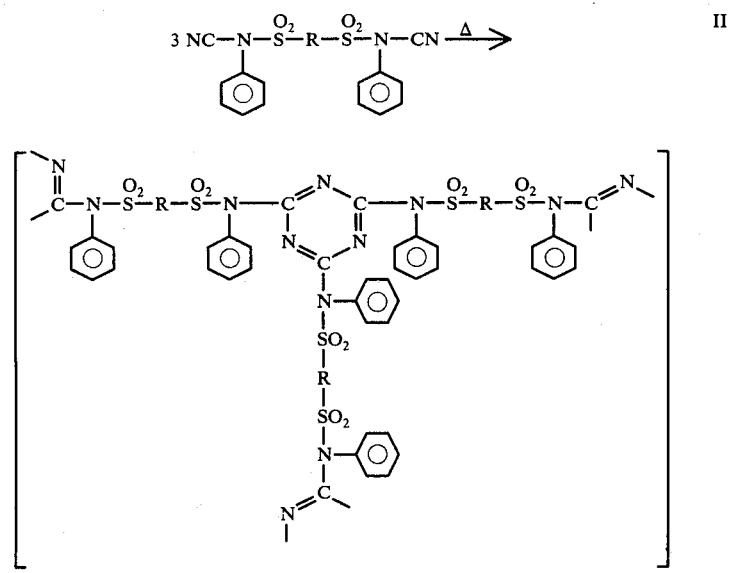

wherein R is as defined previously.

The above illustrated polymers are high molecular weight, three-dimensional, crosslinked structures, the recuring aromatic and heterocyclic rings conferring high thermal stability, chemical inertness and water and solvent resistance. The polymers do not soften below their decomposition temperatures and have glass transition temperatures (Tg's) generally above 300° C. The polymers from monomers of structure I are more rigid and have higher Tg's than the more flexible polymers from structure II that have a greater distance between the crosslinking sites. Thermogravimetric analysis in air shows that these polymers have short term stability up to 300° C. with approximately 10% or less weight loss reached at 350° C. Physical properties of these polymers are retained during isothermal aging at 260° C. over extended periods of time.

The polymerization data in Table I indicates that polymerization below a temperature of 200° C. takes place at a relatively slow rate. For a number of applications it is desirable to process and fabricate thermosetting polymers at as low a temperature as possible and as rapidly as possible for economic reasons. On the other hand, the polymerization of aromatic bis cyanamides containing two or more groups having the structure shown in formula II normally takes place very rapidly at low temperatures even in the solid state below the temperature at which the melting point is reached. This fact makes the polymers prepared from aromatic bis cyanamides of very limited utility since they cannot be maintained in a molten state for a sufficient period to be shaped or fabricated into finished parts. In fact the melting points of aromatic bis cyanamides containing no aliphatic groups cannot be obtained.

It has unexpectedly been found that the solution to both of these problems, i.e., non-melting of aromatic bis cyanamides and slow polymerization of the N-cyanosulfonamide compounds at moderate temperatures can be solved by the copolymerization of the N-cyanosulfonamide compounds with aromatic bis cyanamides at various molecular ratios. At the lower limit it requires approximately 0.1 mole of aromatic bis cyanamide per mole of N-cyanosulfonamide compound to noticeably accelerate the polymerization rate at 180° C. At the upper limit, extremely fast thermosetting compositions are achieved at 140° C. with approximately three moles of aromatic bis cyanamide to one mole of N-cyanosulfonamide compound. In order to allow sufficient time for melt flow and removal of solvent, if present, while processing between 140°–180° C., a preferred range of approximately 0.5 mole to 0.3 moles of aromatic bis cyanamide compound per mole of N-cyanosulfonamide has been found optimal.

In Table IV it is shown that increasing the molar concentration of bis cyanamide in mixtures of N-cyanosulfonamidebis cyanamide results in a more rapid cure as determined by Torsional Braid Analysis measurements of Tg's.

A possible mechanism by which the copolymerization reaction between bis cyanamides and N-cyanosulfonamides may take place is illustrated below:

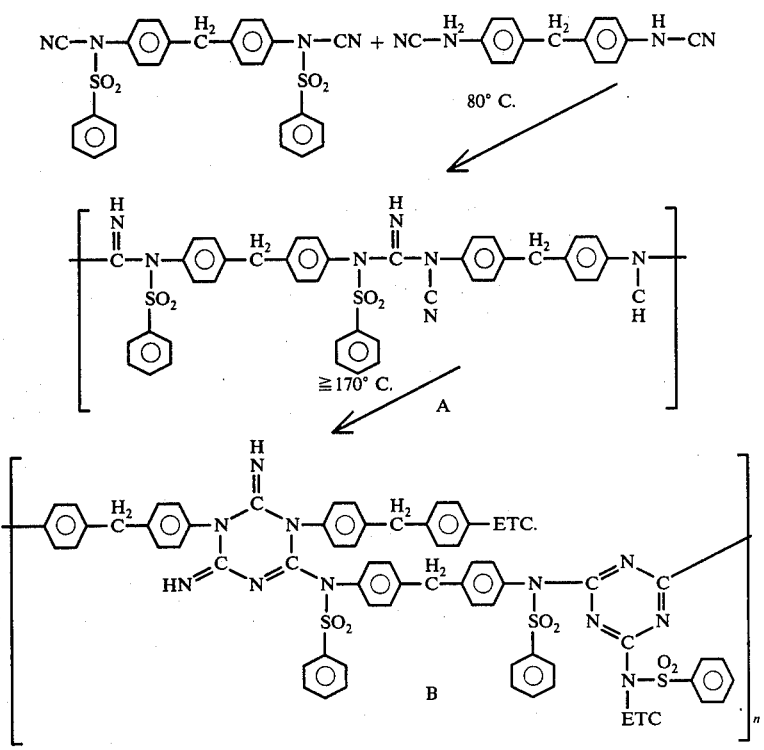

Table IV

Polymerization of 4,4'-Methylene bis(N-benzene sulfonyl phenyl cyanamide) (MBSPC) with 4,4'-Methylene bis phenyl cyanamide (MBPC)

| Curing Time in Hrs. at 178° C. | Tg of 2:1/ MBSPC:MBPC | Tg of 1:1/ MBSPC:MBPC | Tg of 1:3/ MBSPC:MBPC |
|---|---|---|---|
| 0.5 | — | 177° C. | 215° C. |
| 1.0 | — | 205° C. | — |
| 1.75 | — | 227° C. | — |
| 2.50 | 178° C. | 227° C. | — |

By studying the reaction between model compounds of N-cyanosulfonamide-bis cyanamide mixtures it was demonstrated that both species preferentially react with one another (copolymerize) rather than forming a mixture of homopolymers. N-benzene sulfonyl phenyl cyanamide, (0.02 moles), m.p. 59° C. and phenyl cyanamide (0.04 moles), m.p. 40° C. were stirred in the melt for 3 hours at 82° C. at which point the melt solidified. The reaction mixture was then dissolved in methyl ethylketone and the solution was heated at reflux temperatures overnight. The product was isolated by pouring the solution into pentane. It melted at 85° C. and upon mass spectral measurements gave a parent ion at m/e 494 (theory 494). Upon heating at 200° C. the product showed by infrared analysis the presence of the isomelamine ring. Elemental analysis, found C 65.54, H 4.49, N 17.65, S 6.48; Theory: C 65.60, H 4.46, N 17.00, S 6.48.

It has been found that the reaction of bis cyanamides and N-cyanosulfonamide compounds takes place in two stages. In the first stage a soluble, meltable precursor is formed which can be designated by structure A above. A is formed by heating the two reactants in solution at elevated temperatures. Among the solvents found for this purpose are aliphatic ketones, alcohols, and esters. Laminating varnishes containing up to 70% resin solids concentrations at low solution viscosities can be prepared if the reactants are heated at reflux in solvents with low boiling points for periods of approximately 0.5 to 3 hours. Preferred solvents for the preparation of these laminating varnishes are methyl ethyl ketone, acetone, methanol, ethanol, methyl acetate, ethyl acetate, acetonitrile and methyl formate. Mixtures of these solvents can also be employed in various ratios including azeotropic compositions. Molding powders can be isolated from these solutions by evaporation of the solvents or by adding the solutions to a non-solvent for the resin. Preferred non-solvents for isolation of the molding powders are hydrocarbons like pentane, isopentane, cyclopentane, n-hexane, heptane, cyclohexane and mixtures such as low boiling petroleum ether. The molding powders of this invention generally melt in the temperature range between 75° to 140° C.

Heating of these resins within this temperature range causes them to advance so that their melt viscosity increases with time while still maintaining solubility and fusibility. In this state they can most usefully be processed or fabricated to finished articles by press or autoclave molding techniques. Heating of the resins within the temperature range approximately between 150° C. to 300° C. causes them to crosslink or cure and achieve a structure similar to that shown by B above. In this state the resin is insoluble and infusible and has excellent mechanical strength for structural applications and good electrical properties.

The infrared spectra of the resins prepared from the bis cyanamides and N-cyanosulfonamide compounds of this invention indicate the formation of s-triazine ring formation upon curing at temperatures above approximately 200° C.

It has long been the desire of polymer chemists to provide a method for the convenient processing of polymers containing only aromatic and heterocyclic rings like s-triazine because of their known thermal stability, high temperature physical properties, and good electrical properties. Previous investigators (see U.S. Pat. Nos. 3,694,408, 3,654,192 and 3,308,101) were able to obtain solutions of polymerizable precursors only in high boiling solvents like dimethylacetamide or trifluoromethane sulfonic acid from whence they could cast thin films for evaluation. Fabrication of thick sections with these resins was extremely difficult if at all possible because of solvent removal problems or premature gelation of the resin before forming it inot the desired shape. The novel polymerizable precursors of this invention, however, can be dissolved at up to 70% concentration in low boiling ketones, alcohols, or esters to provide a practical method of preparing prepregs of high resin content for laminating and adhesive applications. These prepregs and tapes have good drape and tack for shaping around forms or tools and can be vacuum-bagged or autoclave processed to yield large void free, structural parts. On the other hand, due to the low boiling point of these solvents they can be removed at low temperatures without causing premature advancement or gelation of the resin. In the solvent free state "dry" prepregs, adhesive tapes and molding powders can be compression molded to yield void free parts.

A large number of bis cyanamides have been found to be useful in forming copolymers with N-cyanosulfonamide compounds. Among the preferred aromatic bis cyanamides are included m-phenylene bis cyanamide, p-phenylene bis cyanamide, 3,3'-bis cyanamidodiphenyl methane, 4,4'-bis cyanamidodiphenylmethane, 4,4'-bis cyanamidodiphenylether, m-xylylene bis cyanamide, p-xylylene bis cyanamide 2,4-tolylene bis cyanamide, 2,6-tolylene bis cyanamide, 4,4'-bis cyanamidodiphenyl, 3,3'- and 4,4'-bis cyanamidobenzophenone, 4-chloro-1,3-phenylene bis cyanamide, dicyanamidodurene, 4,6-dimethyl-1,3-phenylene bis cyanamide, 2,5-dichloro-1,4-phenylene bis cyanamide, 2,3,5,6-tetrachloro-1,4-phenylene bis cyanamide, 3,3'-dimethyl-4,4'-bis cyanamidodiphenylmethane, 4,4'-bis cyanamidodiphenyl sulfide, 4,4'-bis cyanamidodiphenyl sulfone, 4,4'-bis cyanamidodiphenylmethane, 4,4'-bis cyanamidodiphenyl sulfide, 4,4'-bis cyanamidodiphenyl sulfone, 1,4-bis (3'-cyanamidobenzoyl) benzene, 1,3-bis cyanamidonaphthalene, 1,5-bis cyanamidonaphthalene, tris (4-cyanamidophenyl) methane, and 3,3'-dichloro-4,4'-bis cyanamidophenylmethane. Other suitable bis cyanamides can be derived from the structures below.

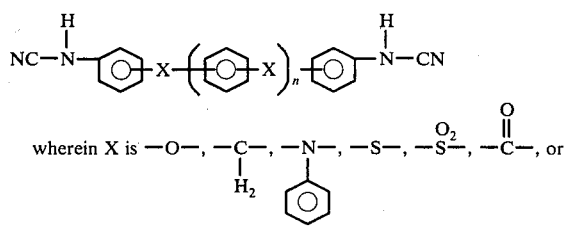

wherein X is —O—, —C—, —N—, —S—, —S—, —C—, or
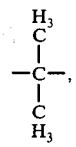

$n$ is one to five and the

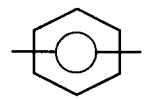

group is replaced by either

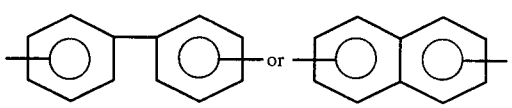

groups.

Any of the hydrogen atoms in these benzenoid radicals may be replaced with chlorine, bromine, or fluorine groups to increase the fire retardancy of the resins.

Among the suitable aliphatic and cycloaliphatic bis cyanamides are pentamethylene bis cyanamide; tetramethylene bis cyanamide; bis(4,4'-dicyanamidocyclohexyl) methane; 1,4-cyclohexylene bis cyanamide; hexamethylene bis cyanamide; dodecamethylene bis cyanamide; octamethylene bis cyanamide.

Among the suitable heterocyclic bis cyanamides are 2,5-bis(m-cyanamidophenyl)-1,3,4-oxadiazole; 2,5-bis(3-cyanamidophenyl)-thiazolo[4,5-d]thiazole; 4,4'-bis(m-cyanamidophenyl)-2,2'-bithiazole; and 2,2'-bis(m-cyanamidophenyl)-5,5'-bibenzimidazole.

Any of the polymeric compositions of this invention can be blended with inorganic fillers and fibers or organic fibers to yield reinforced composites having either a lower overall cost or enhanced physical and electrical properties.

Addition of solutions of the N-cyanosulfonamide resins to a hydrocarbon non-solvent yields finely divided powders which can be given an electrostatic charge and applied as a coalesable powder coating to heated surfaces.

Since the polymeric precursors of this invention melt within the temperature range from 75° C. to approximately 150° C. they can be fabricated with the readily available commercial processing equipment utilizing low cost tooling and bagging materials. Good control can be maintained at the time of gelation at the fabrication temperature so that both rapid or slow processing cycles can be obtained. This is achieved by varying the ratio of bis cyanamide to N-cyanosulfonamide compound — the higher this ratio the faster the polymeric compositions thermoset. High ratios are preferred for rapid molding cycles and low ratios are preferred for the slower vacuum bag and autoclave processing cycles. Thus, the melt flow in inches of a 2/1 molar ratio of 4,4'-methylene bis(N-benzene sulfonyl phenyl cyanamide) to 4,4'-methylene bis phenyl cyanamide was measured at two different temperatures until the resin thermoset.

It was demonstrated that melt flow for fabrication can be maintained for as long as 20 minutes at 178° C. or 5 minutes at 240° C. with no threat of premature gelation.

The fabricated moldings, composites, and coatings can be given post cures for several hours in an oven at temperatures up to 260° C. in order to maximize their physical properties. The fully cured resins are not attacked by organic solvents, have a low water absorption, low dielectric constant, do not support combustion and maintain good mechanical properties up to 260° C. The oxidative stability of these resins in air at 260° C. is good and the mechanical properties are retained for long periods in air at elevated temperatures.

Applications in circuit boards, potting compounds, honeycomb panels, structural parts of airplanes where weight saving is important, hot melt adhesives, and protective coatings are visualized as important areas of application for these resins.

The object and advantages of this invention are further illustrated by the following examples, but the particular materials and amounts recited in these examples as well as other conditions and details, should not be construed as limiting this invention.

EXAMPLE 1

To a 3 liter 3-necked flask equipped with a stirrer, additional funnel, thermometer and drying tube was charged 525 ml. acetone, 42g (0.169 moles) of 4,4'-methylene bisphenylcyanamide and 37.6g (0.372 moles) of triethylamine. A solution of 59.8g. (0.338 moles) of benzene sulfonyl chloride (99%) in 275 ml. of acetone was added dropwise to the stirred solution while maintaining the temperature between 25°–35° C. The resulting suspension was stirred vigorously for one hour at room temperature. The hydrochloride salt was filtered off and washed with acetone until the filter cake was entirely water soluble. The filtrate was concentrated to 200 ml. by boiling off the excess acetone. To the concentrate was added with stirring 1 liter of methanol to precipitate the product. The suspension was cooled to 0° C. and stirred for one hour and then filtered.

The filter cake was washed with a minimum of cold methanol, air dried on the filter and then dried at 60° C. and 1 mm. in a vacuum oven for 1 hour to yield 68.4g (76.5%) of 4,4'-methylene bis(N,N'-benzene-sulfonyl phenyl cyanamide), m.p. 123°–125° C. The C 61.30; H 3.82; N 10.59; S 12.11; Found: C 61.29; H 4.08; N 10.34; S 12.09.

EXAMPLE 2

To a 100 ml. 3-necked flask equipped with a stirrer, addition funnel, thermometer and drying tube was charged 5.0g (0.02 mole) of 4,4'-oxybisphenyl cyanamide, 2.50g (0.022 mole) of triethylene diamine and 40 ml. of acetone. To the reaction mixture was added dropwise a solution of 7.06g (0.04 mole) of benzene sulfonyl chloride in 15 ml. of acetone. The reaction mixture was stirred for two hours and then poured into 750 ml. of rapidly stirred water. The resulting precipitate was filtered off, washed with water and dried. The product was recrystallized from an acetone-methanol mixture to yield 8.0g of pure 4,4'-oxybis-N-benzene sulfonyl phenyl cyanamide, m.p. 161°–162° C.

EXAMPLE 3

To a 2 liter 3-necked flask equipped with a stirrer, addition funnel, thermometer and drying tube was charged 12.4g (0.09 mole) of meta phenylene biscyanamide, 9.9g (0.088 mole) of triethylene diamine and 475 ml. of acetone. To the reaction mixture was added dropwise a solution of 31.2g (0.176 mole) of benzene sulfonyl chloride dissolved in 40 ml. of acetone. The reaction mixture was stirred for 3.5 hours and then poured into a rapidly stirred solution of 10% aqueous sodium bicarbonate. The resulting precipitate was filtered off, washed with water and recrystallized from an acetonemethanol mixture to yield 26.5g (77.1% yield) of pure N,N'-benzene sulfonyl-m-phenylene biscyanamide, m.p. 143°–144° C.

EXAMPLE 4

To a 200 ml. 3-necked flask equipped with a stirrer, addition funnel, thermometer and drying tube was charged 2.36g (0.02 mole) of phenyl cyanamide, 1.23g (0.011 mole) of triethylene diamine and 25 ml. of acetone. A solution of 3.67g (0.01 mole) of p,p'-oxybisbenzene sulfonyl chloride in 35 ml. of acetone was added to the reaction mixture. The resulting suspension was stirred at room temperature for 5 hours and then poured into 750 ml. of 10% $NaHCO_3$ solution. The precipitated product was filtered off, washed with water and dried.

The crude solid was dissolved in acetone and filtered. The filtrate was added to water and the resulting precipitate was collected, washed with water and dried in a vacuum oven to yield 4.0g of p,p'-oxybis-(benzene sulfonyl N-phenyl cyanamide), m.p. 160°–161° C.

EXAMPLE 5

Two grams of 4,4'-methylene bis(N-benzene sulfonyl phenyl cyanamide) in a 20 ml. beaker was placed in a curing oven heated at a temperature of 250° C. The compound melted at 124° C. to form an amber liquid which within an hour polymerized to form a rigid disc. This disc was post cured for one hour at 250° C. followed by one hour at 300° C. The disc was insoluble in boiling DMF and an infra red spectral analysis showed that the nitrile absorption peak at 4.5 microns had disappeared during curing. The thermogravimetric analysis curve showed initial weight loss in air occurred between 350° and 400° C.

EXAMPLE 6

Fifty grams of 4,4'-methylenebis(N-benzene sulfonyl phenyl cyanamide) in a 100 ml. beaker was placed in a curing oven at 180° C. for four hours. During this period the molten compound became increasingly viscous. It was then removed from the oven and found to have a melting point of 95° C. and to be highly soluble in polar solvents such as acetone, MEK, THF and DMF.

A 50% solids solution in acetone was prepared from this compound and a torsional braid was saturated with the solution and dried and heated at 205° C. for 3½ hours. The glass transition temperature of the polymer was 250° C. Upon heating a saturated torsional braid to 300° C. for one hour the glass transition temperature was found to be above 350° C.

A film was cast from the acetone solution and cured for 3 hours at 200° C. and one hour at 260° C. The cured film was isothermally aged at 260° C. and found to retain 80.3% of its weight after 90 hours of aging.

EXAMPLE 7

4,4'-oxy bis (N-benzene sulfonyl phenyl cyanamide), 0.05g, was heated on a Fisher-Johns melting point block. The compound melted at 161°–162° C. and the melt became increasingly viscous as the temperature was raised. Within 5 minutes upon reaching a temperature of 245° C. the melt solidified to form a hard resin that was insoluble in hot DMF.

EXAMPLE 8

Bis(N-benzene solfonyl) m-phenylene dicyanamide 0.05g, was heated on a Fisher-Johns melting point block. The compound melted at 143°–144° C. and the melt became noticeably viscous as the temperature increased to 210° C. Within 5 minutes upon reaching a temperature of 240° C. the melt solidified.

EXAMPLE 9

One gram of 4,4'-oxybis-(benzene sulfonyl N-phenyl cyanamide) from Example 4 was placed in an aluminum dish in a curing oven heated at 215° C. The compound melted to form a colorless liquid which crosslinked within 1½ hours to form a hard thermoset resin that was insoluble in hot DMF and other solvents.

EXAMPLE 10

4,4'-methylene bis(N-benzene sulfonyl phenyl cyanamide), 355g (0.672 mole) and 4,4'-methylene bis phenyl cyanamide, 83.5g (0.336 mole) were dissolved in 293g of methyl ethyl ketone. The solution was refluxed for 18 hours and the resulting 60% resin solids varnish was used to saturate 181E glass cloth (A1100 finish). The glass cloth in a single pass through the laminating varnish retained 35% by weight resin and approximately 2% residual methyl ethyl ketone. A twelve ply laminate was prepared by the vacuum bag-autoclave process. The plies were maintained under vacuum for one hour at 88° C. and then heated at a rate of 1.7° C/minute until a temperature of 163° C. was achieved wherein 90 psig pressure was applied. The temperature was increased to 178° C. and held for one hour at 90 psig pressure. The laminate of 30% resin content was then placed in an oven and post cured for six hours at 250° C. The laminate had a flexural strength of 72,000 psi and a (1:4) short beam shear strength of 6000 psi.

EXAMPLE 11

4,4'-methylene bisphenyl cyanamide, 5.2g, was refluxed in 12g of methyl ethyl ketone for 18 hours. An insoluble mass formed in the bottom of the reaction flask. It was filtered off and dried at 65° C./1 mm. pressure. This polymer was insoluble, did not melt or soften when heated to 300° C. and could not be fabricated into a structural part.

EXAMPLE 12

4,4'-methylene bisphenyl cyanamide, 19.9g, (0.08 moles) and 4,4'-methylene bis(N-benzene sulfonyl phenyl cyanamide), 42.3g, (0.08 mole) were dissolved in 62g, of methyl ketone and the solution was refluxed for 3 hours. The solution was then cooled to room temperature and poured into 700 ml. of rapidly stirred pentane. A white, powdery resin precipitated which was filtered off and dried. This resin weighed 61g. Examination of this resin on the Differential Scanning calorimeter showed that it melted at 114° C., showed polymerization exotherms at 134° C. and 244° C. and gave a crosslinked resin with a glass transition temperature of 327° C.

The resin was blended with 50% by volume of quartz powder and the mixture was heated for 15 minutes at 130° C. to advance the resin. This molding powder was compression molded for one hour at 460° F./3000 psi. The resulting plaque had a room temperature flexural strength of 7640 psi and a flexural strength at 450° F. of 5970 psi. The flexural modulus at room temperature was 1,130,000 psi.

EXAMPLE 13

4,4'-methylene bisphenyl cyanamide, 164g (0.663 mole) and 4,4'-methylene bis(N-benzene sulfonyl phenyl cyanamide) 350g, (0.633 mole) were refluxed for 3 hours in 440g of methyl ethyl ketone to produce a laminating varnish containing 60% resin solids. Glass cloth, 181E (amino silane finish) was saturated with this varnish. The resulting prepreg containing 6% solvent was tacky and drapable. Each plies of prepreg were heated at 130° C. for one hour and then layed up in a nylon vacuum bag and autoclave processed for one hour at 350° F./90 psi. The resulting laminate containing 25% resin had the following physical properties.

| | |
|---|---:|
| Flexural Strength, psi | 67,500 |
| Flexural Modulus, psi | 3,490,000 |
| Short Beam Shear Strength (1:4), psi | 6990 |

EXAMPLE 14

4,4'-methylene bis(N-benzene sulfonyl phenyl cyanamide), 355g, (0.672 mole) and 4,4'-methylene bisphenyl cyanamide, 83.5g (0.336 mole) were refluxed for 16 hours in 294g of methyl ethyl ketone. Glass cloth (181E) was impregnated with this laminating varnish and the resulting prepreg containing 35.4% resin content was vacuum bag-autoclaved at 350° F./90 psi over a two hour period. The laminate was then placed in an oven and post cured for eight hours at 500° F. The resulting laminate containing 30% resin had the following physical properties.

| | |
|---|---:|
| Flexural Strength, psi | 71,800 |
| Flexural Modulus, psi | 2,840,000 |
| Short Beam Shear Strength (1:4), psi | 5887 |

EXAMPLE 15

The laminating varnish prepared in Example 14 was used to prepare a 181E glass cloth prepreg that was heated for 30 minutes at 80° C. to remove the solvent. The dry prepreg was then layed up in 4 plies in a press and laminated at 350° F./500 psi for one hour. The laminate was removed from the press and post cured in an oven at 235° C. for three hours. This laminate contained 30% resin content and had the following physical properties:

| | |
|---|---:|
| Flexural Strength, psi | |
| Room Temp. | 64,400 |
| 450° F. | 55,100 |
| Flexural Modulus, psi | |
| Room Temp. | 3,190,000 |
| 450° F. | 3,070,000 |

EXAMPLE 16

A 181E glass cloth laminate containing 21.3% resin was prepared according to the procedure of Example 15. Test bars for flexural strength tests were cut from this laminate and were placed in a forced draft air oven maintained at a temperature of 500° F. The maintenance of flexural strength of this laminate during oxidative exposure at 500° F. was observed as follows:

| Hours at 500° F. | Flexural Strength, psi |
| --- | --- |
| 0 | 104,000 |
| 100 | 77,100 |
| 250 | 59,000 |
| 500 | 39,800 |

EXAMPLE 17

4,4'-methylene bis(N-benzene sulfonyl phenyl cyanamide), 460g, (0.87 mole) and 4,4'-methylene bisphenyl cyanamide, 460g, (1.85 moles) were dissolved in 1380g of acetone and the solution was refluxed for several minutes. The hot solution was then poured into 15 liters of rapidly stirred low boiling petroleum ether. A prepolymer precipitated from the petroleum ether as a finely divided powder. The prepolymer was dried overnight under vacuum at room temperature. The dried prepolymer weighed 913g (99.2% yield).

A Differential Thermal Analysis determination on a sample of this prepolymer showed that it melted at 111° C. and showed a polymerization exotherm that peaked at 133° C. A portion of the prepolymer was compression molded at 130° C./500 psi for 15 minutes to yield a hard disc. This disc was post cured in an oven at 500° F. for several hours to complete the crosslinking reaction and optimize mechanical strength properties.

EXAMPLE 18

4,4'-methylene bis(N-benzene sulfonyl phenyl cyanamide), 211.4g, (0.400 mole) and 4,4'-methylene bisphenyl cyanamide, 99.5g, (0.400 mole) were dissolved in 257g of methyl ethyl ketone and the solution was heated at reflux for one hour. This laminating varnish was used to saturate a woven fabric composed of polyamide filaments, i.e, PRD-49-111. The saturated fabric was heated in an oven at 90° C. for 25 minutes and then at 120° C. for 10 minutes to remove solvent residues and B-stage the resin. Ten plies of the prepreg were compression molded at 1000 psi by first heating for 1.5 hours at 350° F. followed by 1.0 hour at 400° F. The laminate was removed from the press and placed in an oven to post cure at 450° F. for 5 hours. The resulting laminate had the following physical properties:

| | |
| --- | --- |
| Weight percent resin content | 50.1 |
| Flexural strength, psi | 42,000 |
| Flexural modulus, psi | 3,430,000 |
| Short beam shear strength (1:4), psi | 3750 |

EXAMPLE 19

4,4'-methylene bis(N-benzene sulfonyl phenyl cyanamide), 230g, (0.435 mole) and 4,4'-methylene bisphenyl cyanamide, 230g (0.925 mole) were dissolved in a mixture of 150g of methanol and 50g of acetone and the solution was heated at the reflux temperature for 3 hours. The acetone was then removed from this laminating varnish by distilling off the 88-12 acetone-methanol azeotrope (B.P. 55.7° C.) while adding additional methanol to the varnish to maintain a constant volume. The resulting methanol based varnish of 79% resin content was used to saturate 1528 glass cloth (Volan A finish). The prepreg containing by weight 46.9% of the varnish was B-staged for 15 minutes at 225° F.

Eight plies of the prepreg were laminated to 1 ounce TC copper foil for 30 minutes at 350° F./500 psi. The laminate was post cured in an oven at 235° C. for 24 hours. The copper foil had a peel strength of 7 lbs. per-inch of width as laminated. The laminate had the following electrical properties before and after water immersion.

| | Before Immersion | After 24 hours immersion at 25° C. |
| --- | --- | --- |
| Dielectric Constant at 1MHz; (77° F.) | 4.85 | 4.92 |
| Dissipation Factor at 1MHz; (77° F.) | 0.012 | 0.011 |

EXAMPLE 20

N-benzene sulfonyl phenyl cyanamide 25.8g, (0.10 mole) and 4,4'-methylene bis phenyl cyanamide, 49.7g, (0.20 mole) were dissolved in 72g of methyl ethyl ketone and the solution was heated at reflux for 30 minutes. The resulting laminating varnish of 55% resin solids concentration was used to saturate a woven fabric composed of polyamide filaments, i.e., PRD-49-111. The prepreg was heated at 90° C. for 0.5 hour to remove solvent residues and advance the resin. Seven plies of prepreg were laminated in a press at 1000 psi which was heated for 90 minutes at 300° F. followed by 120 minutes at 400° F. The laminate containing 51.4% resin solids was post cured for 5 hours at 450° F. The post cured laminate had a short beam shear strength (1:4) of 2,240 psi and a flexural modulus of 3,020,000 psi.

EXAMPLE 21

A portion of the laminating varnish from Example 20 was used to saturate a torsional braid which was used in the Torsional Braid Apparatus to determine the glass transition temperature of the polymer at several heating cycles. When the braid was heated for 40 minutes at 178° C. the glass transition of the polymer was 250° C. Further heating for 75 minutes at 250° C. caused the glass transition temperature of the polymer to increase to 275° C.

Precipitation of a portion of the laminating varnish of Example 20 by adding the solution to a rapidly stirred non-solvent, pentane, gave a quantitative recovery of the solid resin which softened at 60° C. and gave a clear melt at 110° C. A sample of the solid resin was cured at 250° C. for 90 minutes and submitted for thermogravimetric analysis. This resin when heated at 5° C./minute in air lost 4% of its weight at 350° C. and 8% of its weight at 400° C.

EXAMPLE 22 p-amino benzene sulfonyl N-phenyl cyanamide, 10.9g (0.04 mole) and 3,3',4',4-benzophenone tetracarboxylic dianhydride, 6.44g, (0.02 mole) were dissolved in 90 ml. of DMF. The solution was heated at reflux for 3 hours. The solution was then cooled to room temperature and poured slowly into 600 ml. of rapidly stirred water. The finely divided precipitate was filtered off washed with water and dried at 185° C. in a vacuum oven. The imide prepolymer weighed 16.3g (98% yield), theory, C 62.0, H, 2.88, N 10.10, S 7.69, found: 60.8, H 3.14, N 10.10, S 7.66.

Infra red analysis confirmed the presence of the imide ring and nitrile group. Differential thermal analysis showed that the imide prepolymer melted at 169° C. and showed a polymerization exotherm commencing between 180°–190° C. A torsional braid curing study showed that this polymer had a glass transition temperature of 310° C. after a two hour heating period at 300° C.

The imide prepolymer was dissolved at 30% by weight concentration in N-methyl pyrrolidone and the solution was cast as a film. The film was heated at 250° C. for one hour to cure the polymer. The cured film was oxidatively aged by heating in a forced draft air oven at 500° F. After 514 hours of aging the film retained 90.3% of its original weight.

EXAMPLE 23

To a 3 liter 3-necked flask equipped with a stirrer, addition funnel, thermometer, and drying tube was charged 93.1g (1.0 mole) of aniline, 111g (1.1 moles) of triethylene diamine and 250 ml. of tetrahydrofuran. To this reaction mixture was added dropwise a solution of 176.6g (1 mole) of benzenesulfonyl chloride in 300 ml. of tetrahydrofuran. The reaction mixture was stirred at room temperature for 2.5 hours and was then filtered. To the filtrate was added 111g of triethylene diamine and this solution was added dropwise to a solution of 87g (1.41 moles) of cyanogen chloride in 100 ml. of THF which was maintained at $-5°$ C. with cooling. After this addition was complete the stirred reaction mixture was allowed to return to room temperature over a 16½ hour period. The reaction mixture was filtered and the filament was added to water to precipitate the product. The product was recrystallized from aqueous methanol to yield 218g (84.7%) of N-benzene sulfonyl phenyl cyanamide, m.p. 65°–66° C.

EXAMPLE 24

4,4'-methylene bis(N-benzene sulfonyl phenyl cyanamide), 237g (0.448 mole) and 4,4'-methylene bis phenyl cyanamide to 335g (1.35 moles) were dissolved in 702g of methyl ethyl ketone and the solution was heated at reflux for one hour. The resulting laminating varnish was used to prepare a prepreg containing polyamide woven fabric PRD-49-111. The prepreg was dried at room temperature under vacuum and eight plies were press laminated at 300° F. for 10 minutes followed by one hour at 400° F. This laminate containing 33.4% by weight resin was post cured for 5 hours at 450° F. The post cured laminate had a short beam interlaminar shear strength (4:1) of 2000 psi.

EXAMPLE 25

4,4'-methylene bis (N-benzene sulfonyl phenyl cyanamide), 10.1g (0.0191 mole) and 4,4'-methylene bis phenyl cyanamide, 30.0g (0.121 mole) were dissolved in 30g of acetone and the solution was refluxed for 10 minutes. The hot solution was poured into one liter of rapidly stirred low boiling petroleum ether to precipitate the prepolymer as a finely divided powder. The dried powder when heated melted at 120° C. and within a few seconds thermoset at this temperature. A differential thermal analysis showed that the polymerization exotherm peaked between 135° to 145° C. and could not be observed above 213° C.

EXAMPLE 26

Bis(N-benzene sulfonyl)m-phenylene dicyanamide, 17.54g (0.04 mole) and m-phenylene dicyanamide, 3.16g (0.02 mole) were dissolved in a mixture of 20.7g of methyl ethyl ketone and 1.1g of dimethyl formamide. The solution was heated at reflux for 16 hours. A portion of this prepolymer solution was used to coat a torsional braid and the glass transition temperature, Tg, was determined in the torsional Braid Apparatus. The Tg was 290° C. after heating the braid for 2 hours at 200° C. followed by one hour at 260° C.

A portion of the prepolymer solution was used to cast a film which was heated for one hour at 260° C. to cure the film. The film was isothermally aged in a forced draft air oven heated at 500° F. After 1014 hours of aging at 500° F. the film retained 66.3% of its original weight.

EXAMPLE 27 p,p'-oxybis-(benzene sulfonyl N-phenyl cyanamide) from Example 4 was heated in a Differential Scanning Calorimeter. A melting point was observed at 164° C., the onset of polymerization at 210° C., and a polymerization exotherm peak at 265° C. When heated in air in a Thermal Gravimetric Analysis Apparatus the cured resin retained 90% of its original weight at 400° C.

EXAMPLE 28 p,p'-oxybis-(benzene sulfonyl N-phenyl cyanamide), 5.31g, (0.01 mole) and 4,4'-methylene bis phenyl cyanamide, 1.24g (0.005 mole) were dissolved in 20 ml. of methyl ethyl ketone and the solution was heated at reflux for 16 hours. The prepolymer was precipitated as a fine powder by pouring this solution into 500 ml. of rapidly agitated hexane. The dried prepolymer melted at 120° C. and thermoset within 15 minutes after being held at a temperature of 215° C. After heating this powder at 300° C. the glass transition temperature was 290° C.

EXAMPLE 29 p,p'-oxybis-(benzene sulfonyl N-phenyl cyanamide, 7.9g, (0.015 mole) and 4,4'-oxybis phenyl cyanamide, 1.89g (0.0075 mole) were dissolved in 10g of methyl ethyl ketone and the solution was heated at reflux for 16 hours. This solution was used to case a film which was cured for one hour at 260° C. The film was isothermally aged in a forced draft air oven at 500° F. and was found to retain 68% of its original weight after 846 hours of aging in air at this temperature.

EXAMPLE 30

Twenty five grams of N,N'-methane sulfonyl-1,6-hexamethylene biscyanamide in a 50 ml. beaker is placed in a curing oven at 200° C. The liquid becomes increasingly viscous and finally thermosets within 90 minutes. The resulting disc is insoluble in boiling DMF.

EXAMPLE 31

N,N'-methane sulfonyl-1,6-hexamethylene biscyanamide, 3.22g (0.01 mole) and 3.32g (0.02 mole) of 1,6-hexamethylene biscyanamide are stirred together in the melt at 90° C. for ½ hour to yield a viscous syrup. This syrup is then placed in a curing oven at 177° C. for 1 hour. A transparent, cross-linked molding is produced that swells only slightly in boiling DMF.

EXAMPLE 32

2,5-bis(meta cyanamidophenyl)-1,3,4-oxadiazole, 3.0g, (0.01 mole) and 3.22 g, (0.01 mole) of the imide prepolymer of Example 22 are dissolved in 50 ml of DMF solution and the solution is used to coat a torsional braid. A torsional braid curing study shows that this polymer has a glass transition temperature of 250°

C. after a 3 hour cure at 200° C. and a glass transition temperature of 315° C. after a two hour heating period at 300° C.

EXAMPLE 33

4,4'-methylene bisphenyl cyanamide, 248g, (1.0 mole) and 4,4'-methylene bis(N-benzene sulfonyl phenyl cyanamide) 248g, (0.47 mole) are dissolved in 500 ml. of acetone and the acetone solution is refluxed for 5 minutes. The acetone solution is then poured into 6 liters of rapidly stirred petroleum ether to precipitate a white, powdery resin which is filtered off and dried under vacuum at room temperature. The dried resin is heated for 10 minutes at 90° C. and then placed in a mold and compression molded at 300° F./3000 psi for 1 hour. The yellow, transparent plaque is removed from the mold and post cured at 500° F. for 2 hours. A flexural bar from this post cured resin has a flexural strength of 16,300 psi and flexural modulus of 616,000 psi.

What is claimed is:

1. A polymer of bis-N-cyanosulfonamide compound of the formula

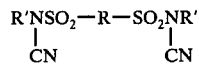

wherein
R is a divalent aromatic, aliphatic, cycloaliphatic or heterocyclic radical; and each R' is independently a monovalent aromatic, aliphatic, cycloaliphatic or heterocyclic radical, with 0 to 10 moles per mole of sulfonamide of a biscyanamide having the formula

wherein R is a divalent aromatic, aliphatic, cycloaliphatic or heterocyclic radical.

2. A polymer of claim 1 wherein the N-cyanosulfonamide has the formula

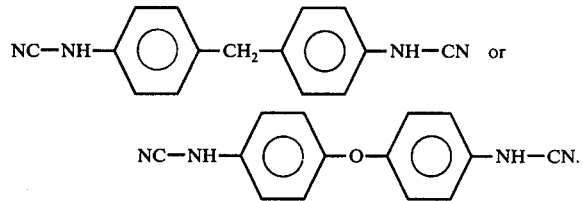

and the biscyanamide has the formula

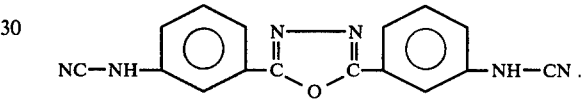

3. A polymer of claim 1 wherein the N-cyanosulfonamide has the formula

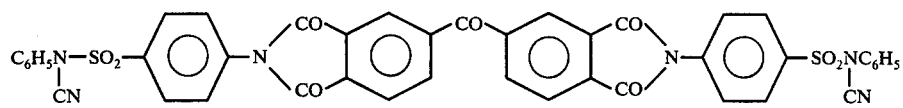

and the biscyanamide has the formula

4. A polymer of claim 1 wherein 1-10 moles of the bis cyanamide are used.

5. A polymer of claim 4 wherein R is a divalent aromatic radical selected from the group consisting of phenylene, bisphenylene, naphthylene and the foregoing radicals linked by divalent groups selected from the group consisting of oxa, carbonyl, lower alkylene, lower alkylidene, sulfonyl, thia, arylimino, amido and imido.

6. A polymer according to claim 1 formed by the polymerization of at least one N-cyanosulfonamide and no bis cyanamide.

7. A laminate of a polymer of claim 1 which consists essentially of a fibrous substrate impregnated with said polymer.

8. A laminate according to claim 7 wherein the fibrous substrate is fibers of glass, graphite, boron, or aromatic polyamide.

9. A molded part of a polymer according to claim 1.

10. A cast film or coating of a polymer according to claim 1.

* * * * *